(12) United States Patent
Derluyn et al.

(10) Patent No.: US 9,543,424 B2
(45) Date of Patent: Jan. 10, 2017

(54) METHOD FOR GROWING III-V EPITAXIAL LAYERS AND SEMICONDUCTOR STRUCTURE

(75) Inventors: Joff Derluyn, Sint-Joris-Weert (BE); Stefan Degroote, Scherpenheuval-Zichem (BE); Marianne Germain, Liege (BE)

(73) Assignee: EpiGaN NV, Hasselt (BE)

( * ) Notice: Subject to any disclaimer, the term of this patent is extended or adjusted under 35 U.S.C. 154(b) by 12 days.

(21) Appl. No.: 14/232,942

(22) PCT Filed: Jul. 6, 2012

(86) PCT No.: PCT/EP2012/063318
§ 371 (c)(1),
(2), (4) Date: Jan. 15, 2014

(87) PCT Pub. No.: WO2013/010829
PCT Pub. Date: Jan. 24, 2013

(65) Prior Publication Data
US 2014/0159119 A1    Jun. 12, 2014

(30) Foreign Application Priority Data
Jul. 18, 2011    (GB) .................................. 1112330.4

(51) Int. Cl.
*H01L 29/778*    (2006.01)
*H01L 29/66*    (2006.01)
(Continued)

(52) U.S. Cl.
CPC ....... *H01L 29/778* (2013.01); *H01L 29/66431* (2013.01); *H01L 29/66462* (2013.01);
(Continued)

(58) Field of Classification Search
CPC ................. H01L 29/2003; H01L 29/33; H01L 29/66431; H01L 29/66462; H01L 29/778; H01L 29/7786
(Continued)

(56) References Cited

U.S. PATENT DOCUMENTS 5,395,792 A * 3/1995 Ikawa .................... H01S 5/2231
148/DIG. 95
5,976,920 A * 11/1999 Nakano ............. H01L 21/28587
257/E21.407
(Continued)

FOREIGN PATENT DOCUMENTS

CN    102017160    4/2011
EP    1134810 A2    9/2001
(Continued)

OTHER PUBLICATIONS

Preliminary Report on Patentability from the international Preliminary Examining Authority, PCT/EP2012/063318 (Oct. 25, 2013).
(Continued)

*Primary Examiner* — Victor A Mandala
*Assistant Examiner* — Colleen E Snow
(74) *Attorney, Agent, or Firm* — McDonnell Boehnen Hulbert & Berghoff LLP

(57) ABSTRACT

Disclosed are methods of growing III-V epitaxial layers on a substrate, a semiconductor structure comprising a substrate, a device comprising such a semiconductor structure, and an electronic circuit. Group III-nitride devices, such as, for example, high-electron-mobility transistors, may include a two-dimensional electron gas (2DEG) between two active layers. For example, the 2DEG may be between a GaN layer and a AlGaN layer. These transistors may work in depletion-mode operation, which means the channel has to be depleted to turn the transistor off. For certain applications, such as, for
(Continued)

example, power switching or integrated logic, negative polarity gate supply is undesired. Transistors may then work in enhancement mode (E-mode).

26 Claims, 10 Drawing Sheets

(51) Int. Cl.
H01L 29/20 (2006.01)
H01L 29/10 (2006.01)

(52) U.S. Cl.
CPC ...... *H01L 29/7786* (2013.01); *H01L 29/1066* (2013.01); *H01L 29/2003* (2013.01)

(58) Field of Classification Search
USPC ............. 257/192, 194, E29.246, E21.403, 257/E21.407; 438/172
See application file for complete search history.

(56) References Cited

U.S. PATENT DOCUMENTS

| 8,519,438 B2* | 8/2013 | Mishra et al. ............... 257/192 |
| 2004/0164317 A1 | 8/2004 | Nishihori et al. |
| 2006/0043396 A1* | 3/2006 | Tsuda et al. ................ 257/94 |
| 2006/0083280 A1* | 4/2006 | Tauzin ............. H01L 21/76254 372/46.01 |
| 2008/0093626 A1* | 4/2008 | Kuraguchi .................. 257/190 |
| 2009/0072272 A1 | 3/2009 | Suh et al. |
| 2009/0146182 A1 | 6/2009 | Hikita et al. |
| 2009/0194790 A1 | 8/2009 | Sato et al. |
| 2010/0025730 A1 | 2/2010 | Heikman et al. |
| 2010/0084687 A1* | 4/2010 | Chen et al. ................. 257/194 |
| 2012/0223320 A1* | 9/2012 | Dora .................. H01L 29/1608 257/76 |
| 2013/0292686 A1* | 11/2013 | Kizilyalli et al. ............. 257/76 |

FOREIGN PATENT DOCUMENTS

| EP | 1424734 A2 | 2/2004 |
| EP | 1610392 A1 | 12/2005 |
| JP | 2001177089 A | 6/2001 |
| JP | 2004179318 A | 6/2004 |
| JP | 2004193273 A | 7/2004 |
| JP | 2006121091 | 5/2006 |
| JP | 2009503815 A | 1/2009 |
| JP | 2009188397 A | 8/2009 |
| WO | WO2007018918 A2 | 2/2007 |
| WO | 2009132039 | 10/2009 |

OTHER PUBLICATIONS

International Search Report from the European Patent Office, PCT/EP2012/063318 (Nov. 5, 2012).
David C. Hays, Selective Etching of Compound Semiconductors, University of Florida Masters Thesis, 1999, 1-138.
Notification of Reasons for Refusal, Mailing Date Mar. 22, 2016, English Translation of Japanese Patent Office Action in Application No. 2014-520602.
The State Intellectual Property Office of the People's Republic of China (SIPO), Search Report Dated Feb. 14, 2016, Application No. 201280035805.9, Application Date: Jul. 6, 2012, Applicant: EPIGAN NV, (1 page).

* cited by examiner

Figure 1: structure of first epitaxial stack
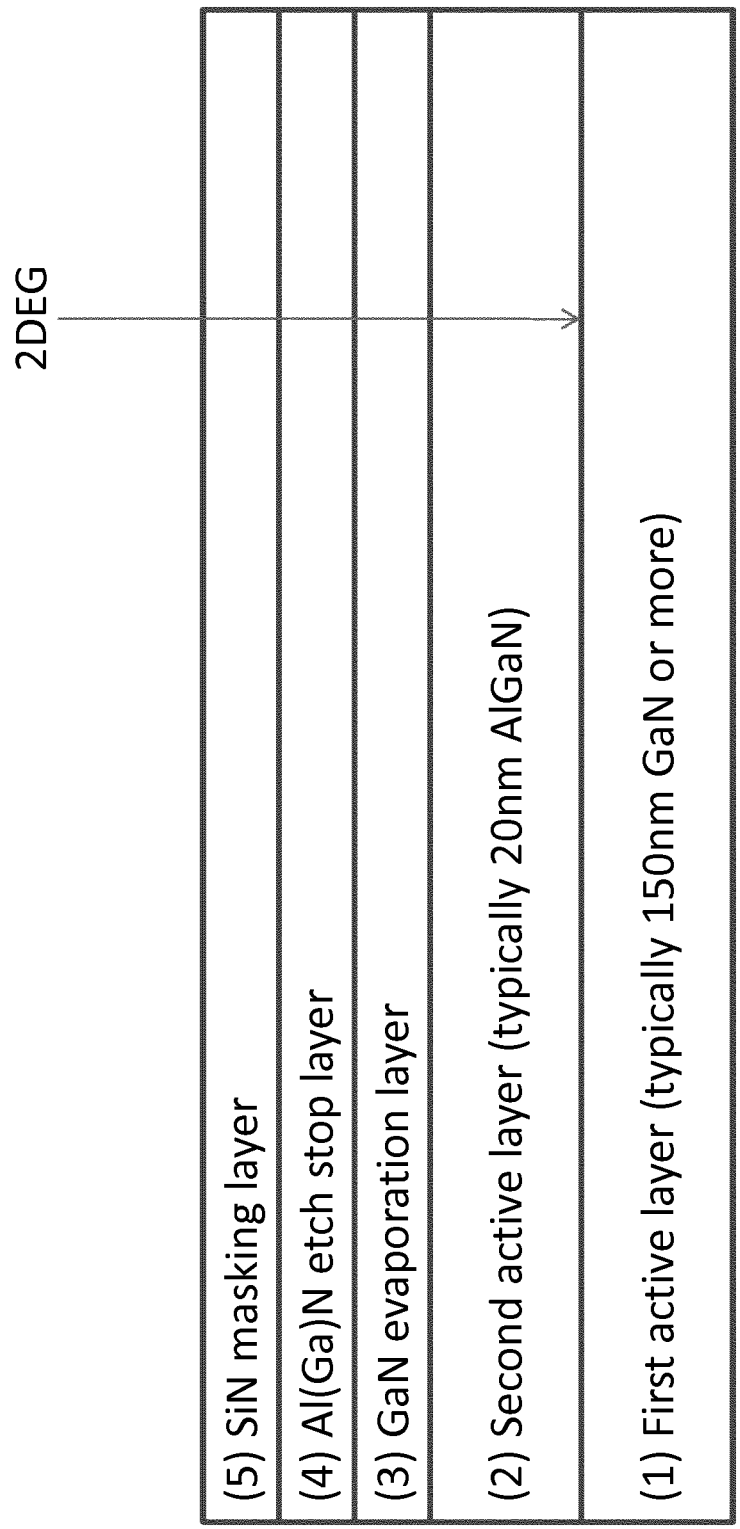

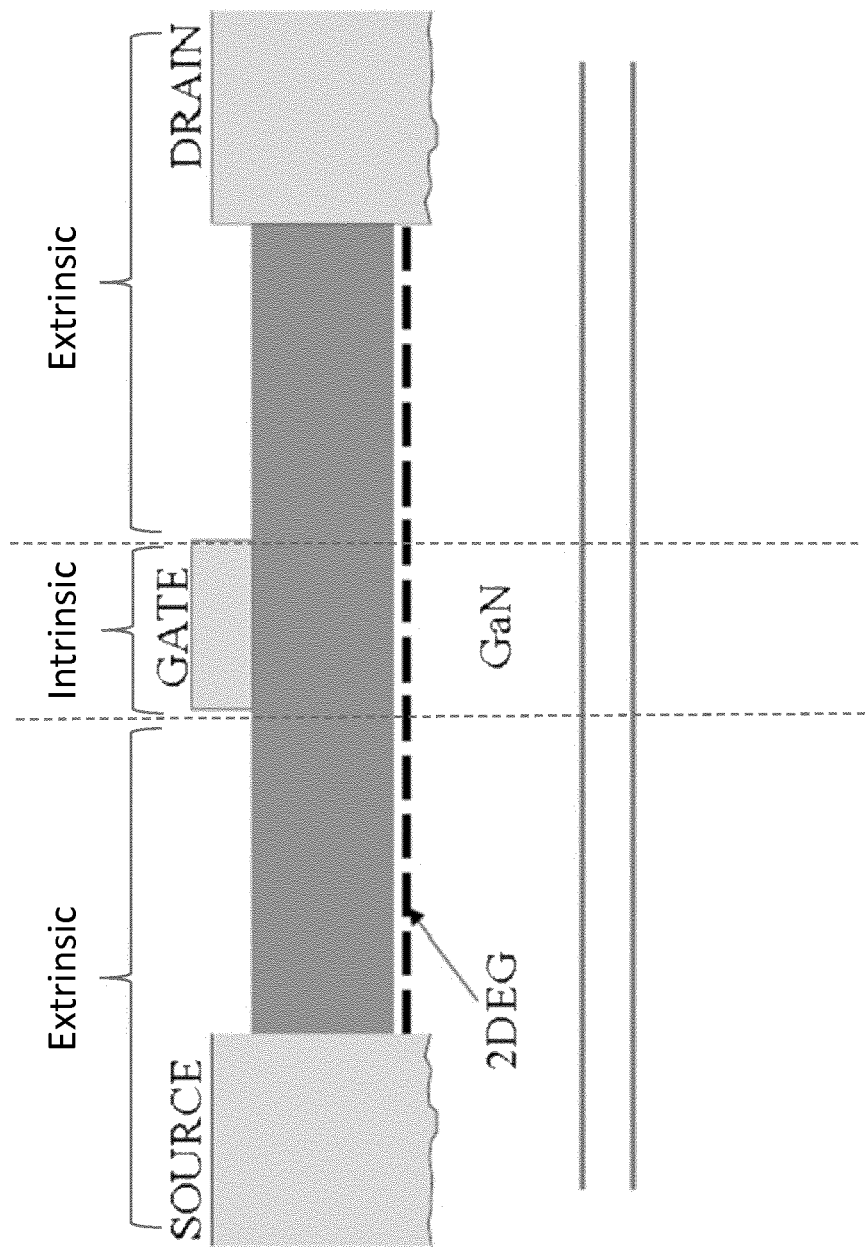

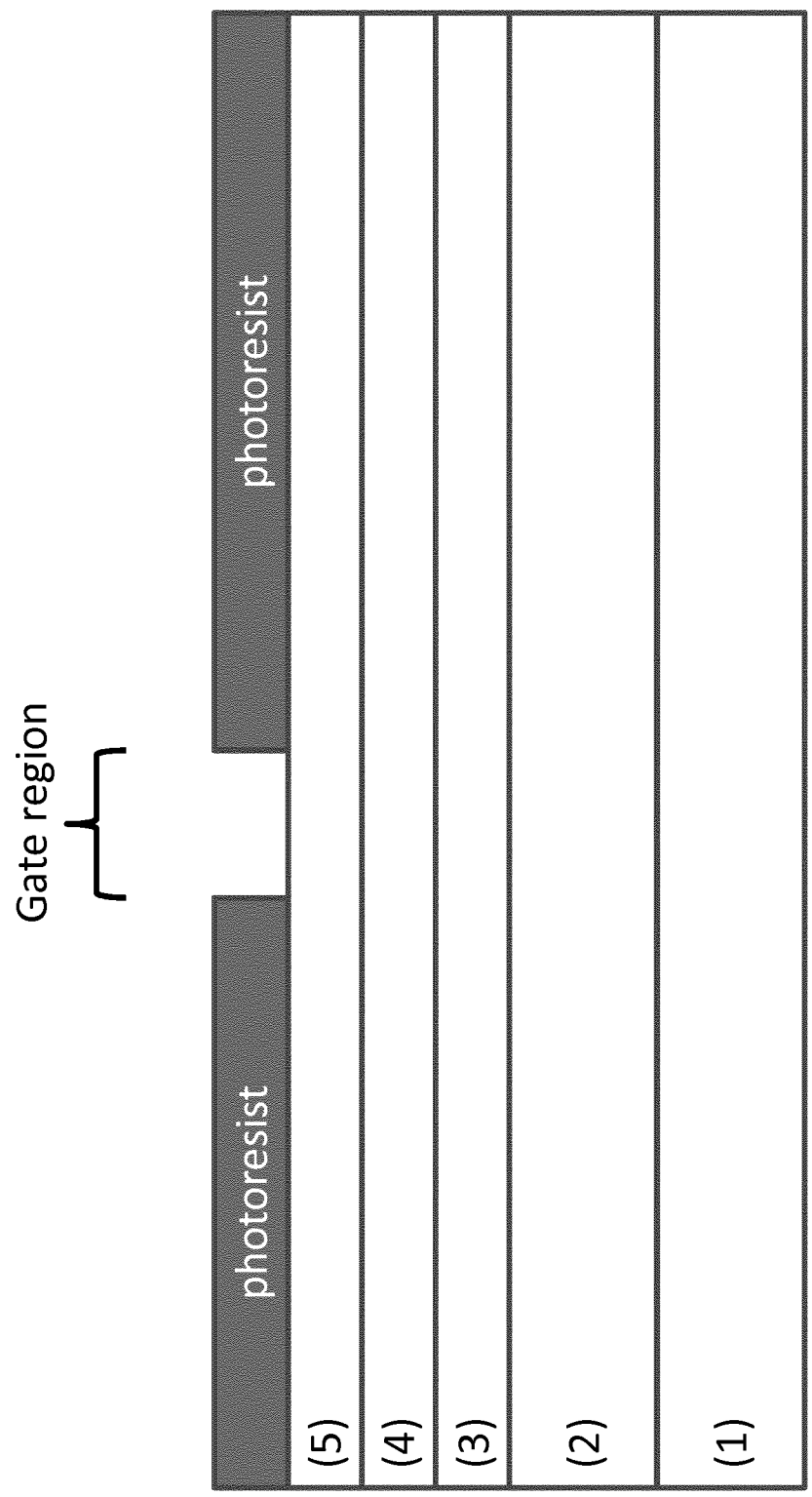

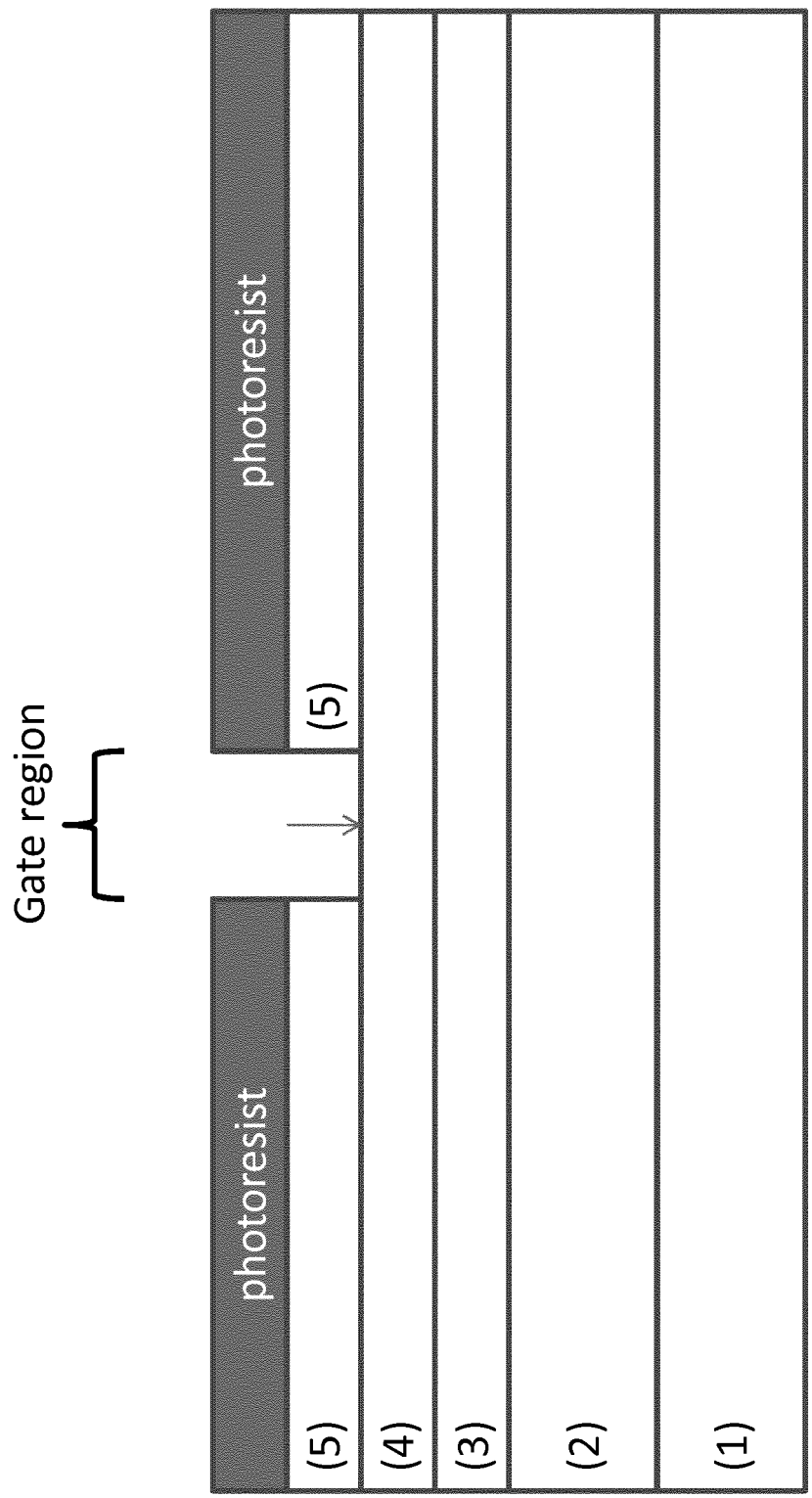
Figure 3b: SiN etch

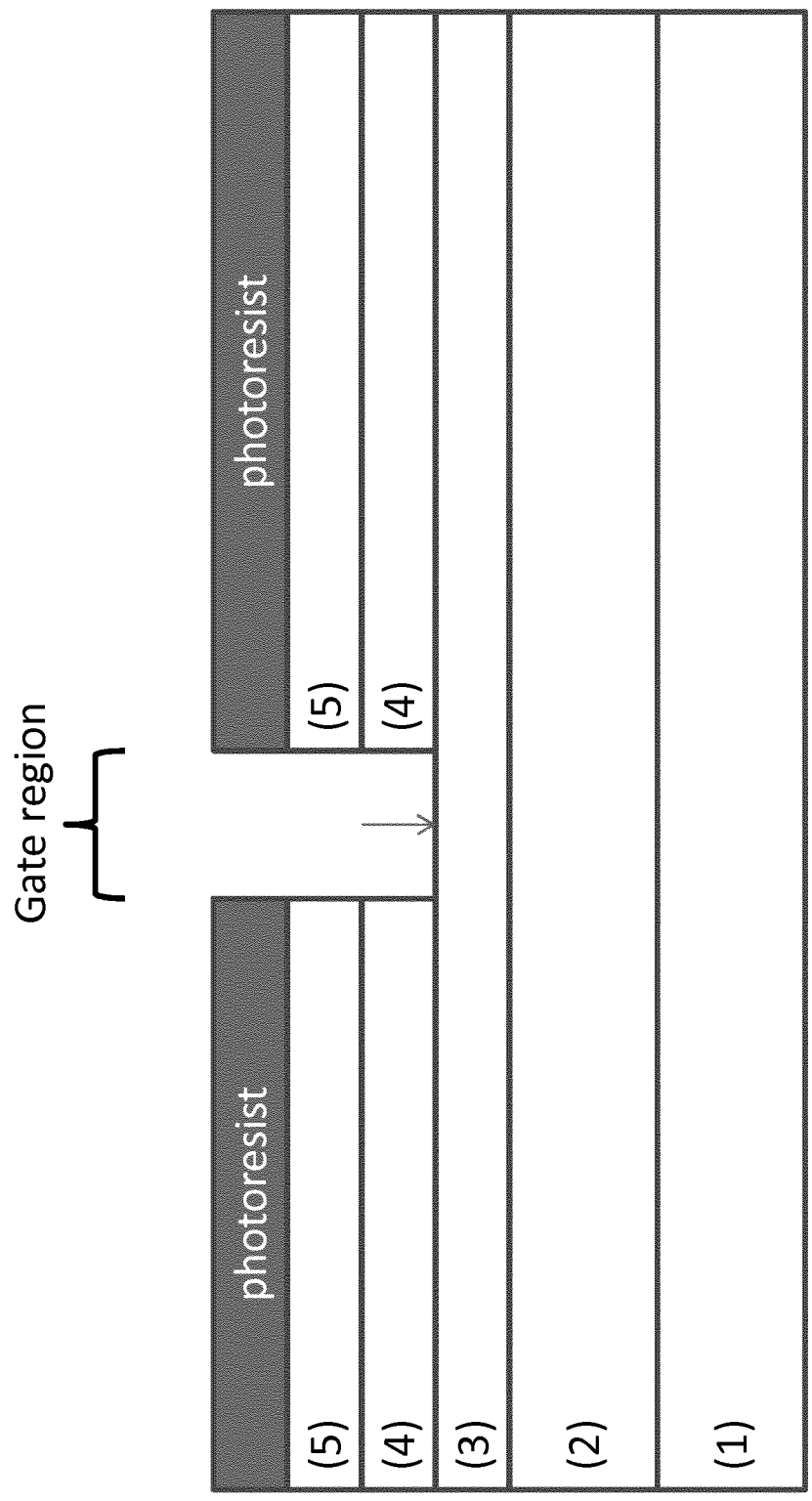

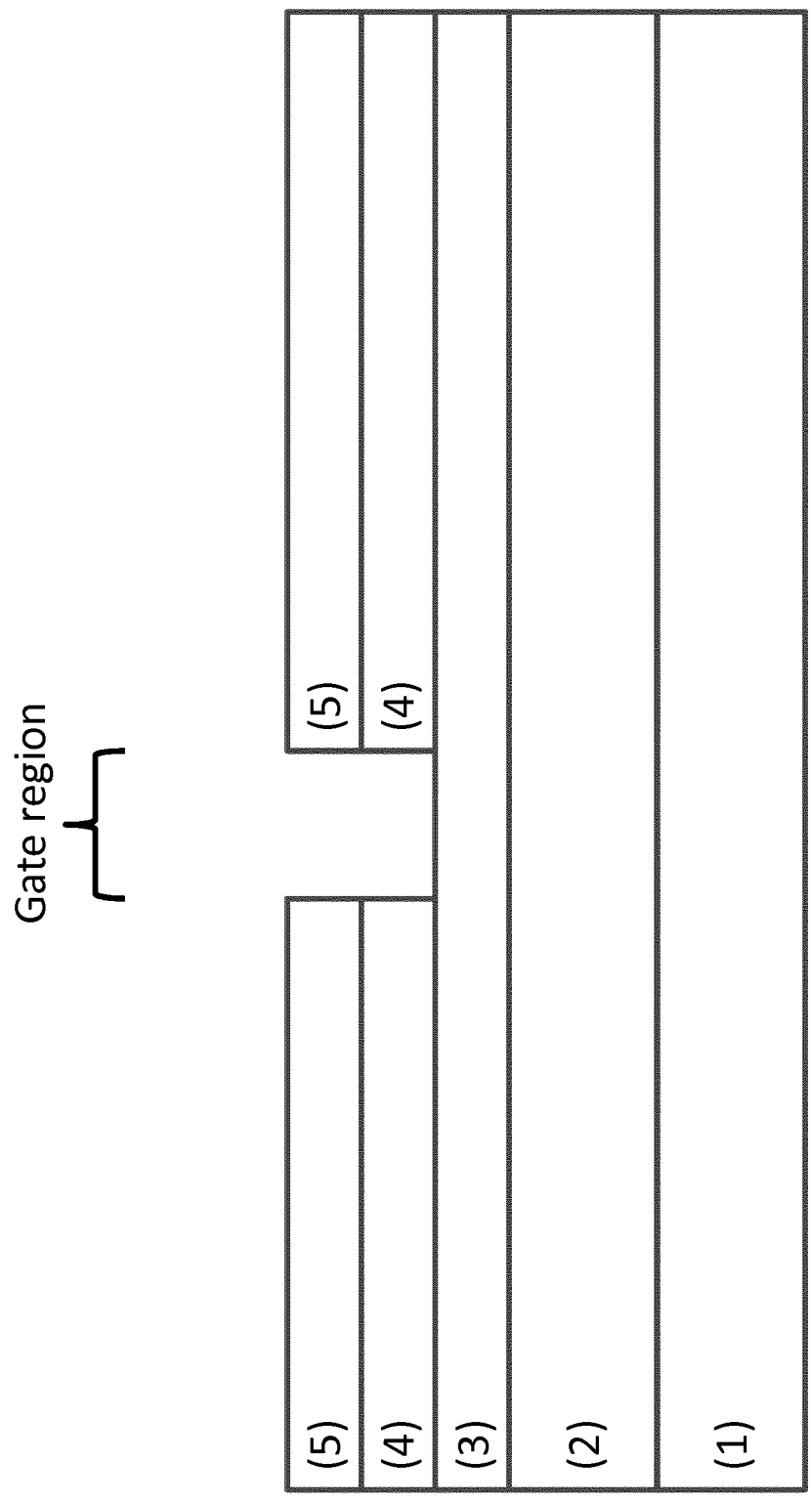
Figure 3d: photoresist strip

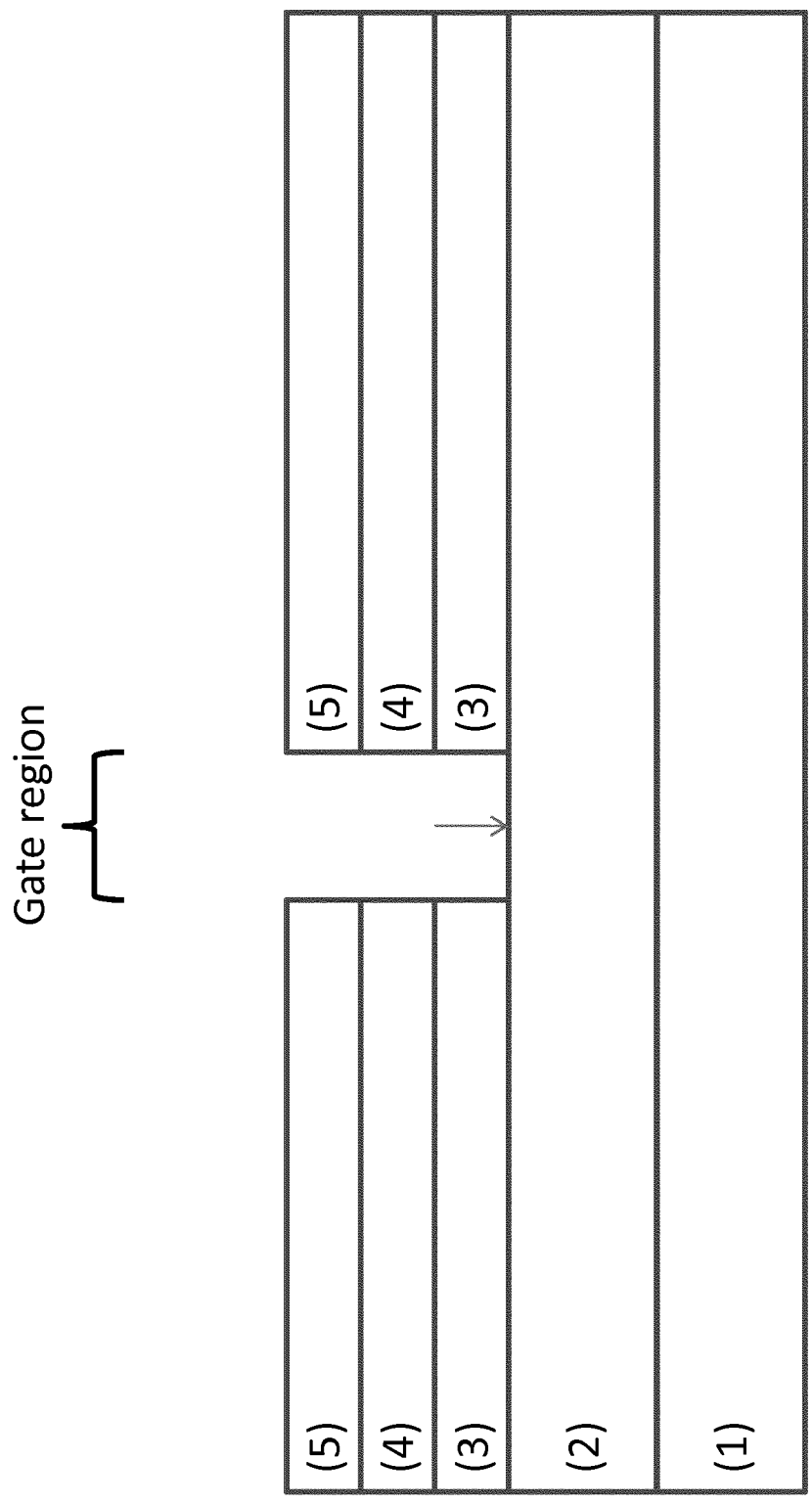
Figure 3e: GaN evaporation in MOCVD reactor

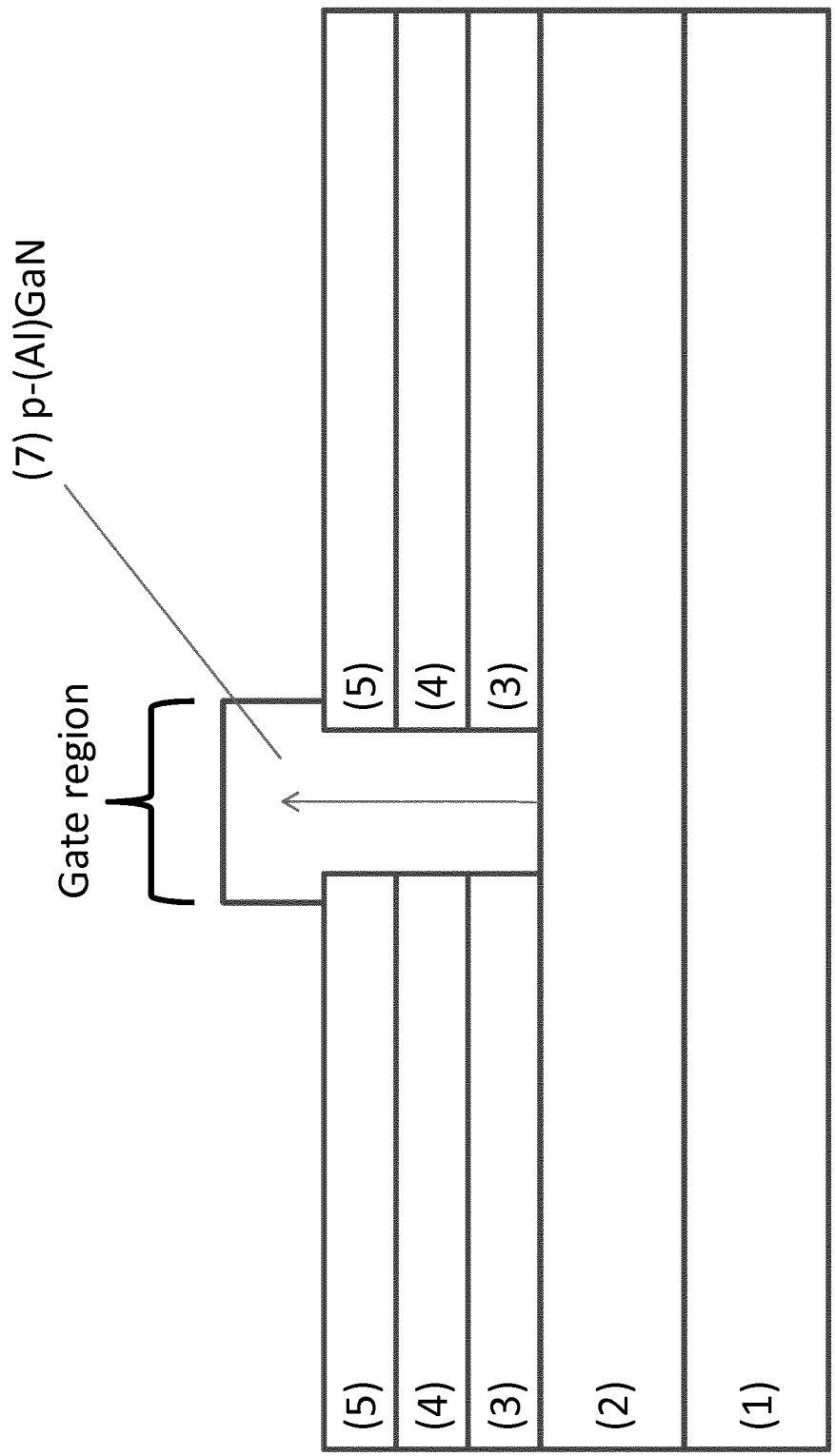

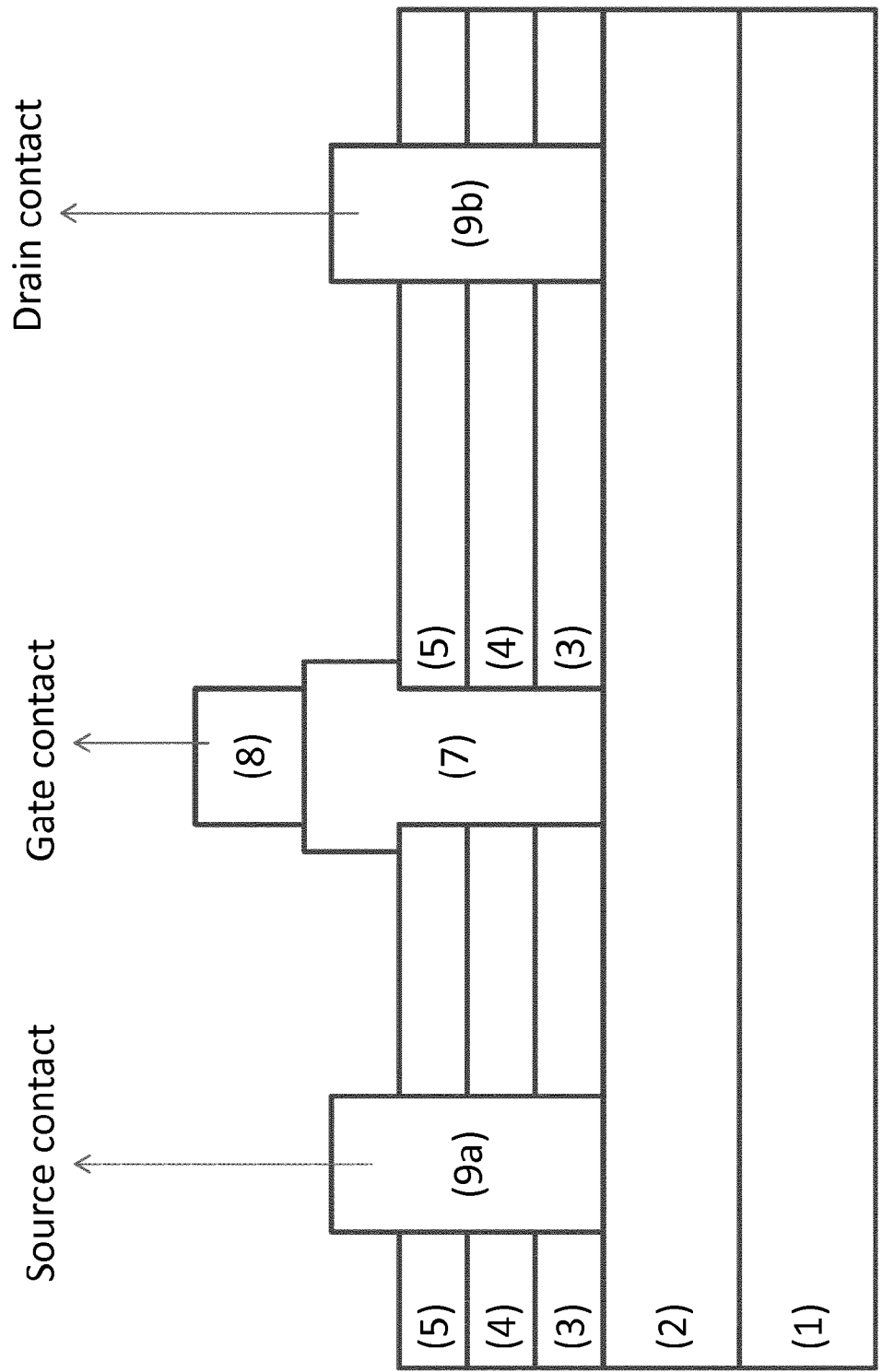
Figure 3g: postprocessing of metallic contacts

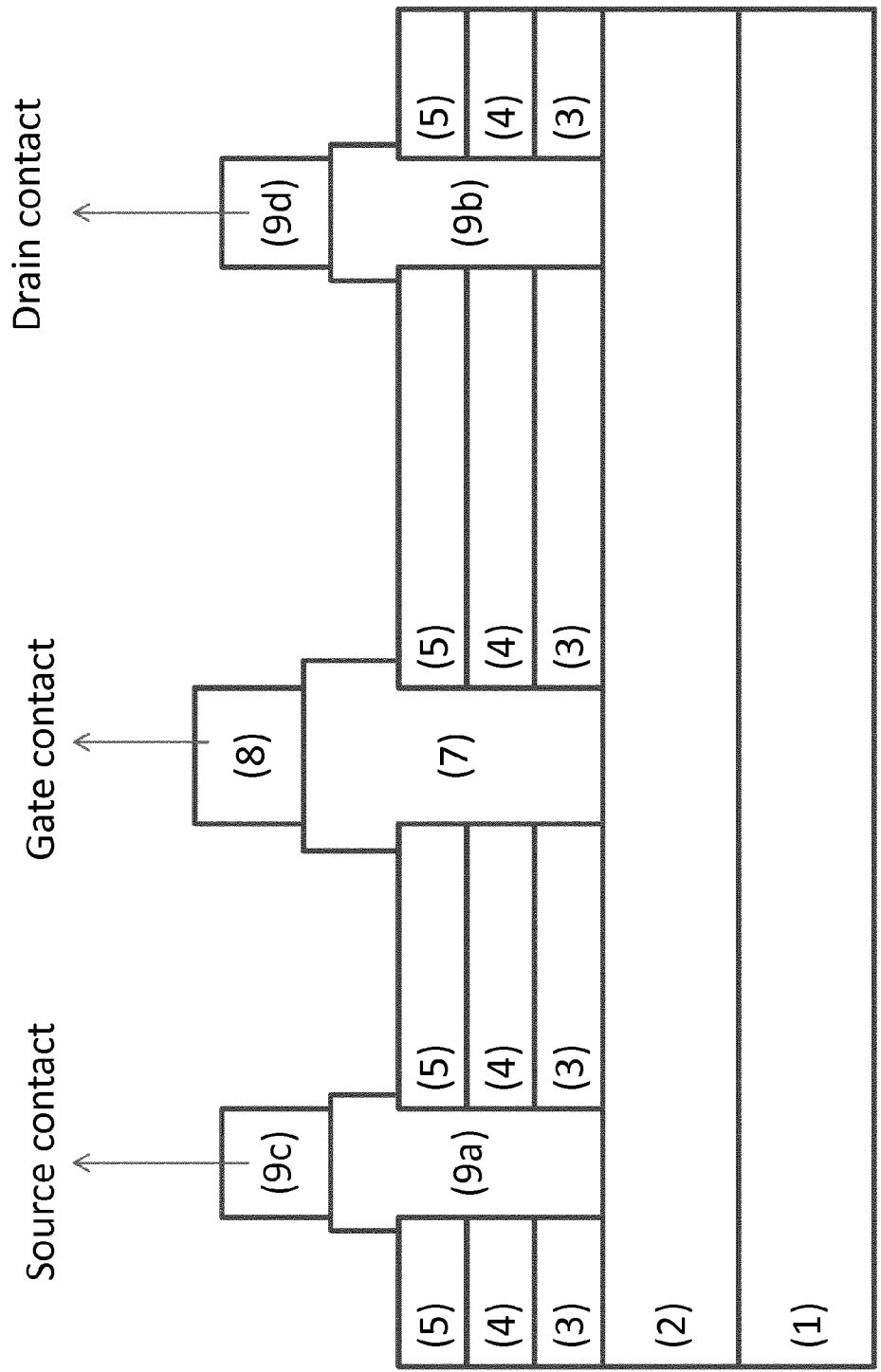
Figure 3h: postprocessing of metallic contacts including n-type InGaN regrowth

METHOD FOR GROWING III-V EPITAXIAL LAYERS AND SEMICONDUCTOR STRUCTURE

FIELD OF THE INVENTION

The present invention relates to a method of growing III-V epitaxial layers on a substrate, a semiconductor structure comprising a substrate, a device comprising such a semiconductor structure, and an electronic circuit.

TECHNICAL BACKGROUND

Group III-V devices, such as e.g. HEMTs, comprise a 2DEG (two dimensional Electron Gas) between two active layers, e.g. between a GaN and a AlGaN layer. It is known that this 2DEG results from spontaneous and piezo-electric polarization leading to charge separation within the materials. In most known devices of this type, the 2DEG is present at zero gate bias due to the characteristics of the materials. GaN FET devices for instance, with contacts formed on top of an AlGaN barrier layer, are normally-on devices. It is assumed that the formation of contacts on top of the epitaxial structure does not change drastically the polarization charges in a heterostructure such that if a 2DEG were present before the formation of the contacts, it would remain there after the processing. A certain negative voltage, called threshold voltage, on the gate is required to deplete the 2DEG through capacitive coupling. By applying a negative voltage to the gate an electron channel can be pinched off. This negative voltage is typically below a negative threshold voltage ($V_{th}$), typically between −2V and −8V. These transistors work in depletion-mode operation which means the channel has to be depleted to turn the transistor off.

For certain applications, such as e.g. power switching or integrated logic, negative polarity gate supply is undesired. In such a case, the gate control needs to work in such a way that, if the controlling circuitry fails for whatever reason, there is no galvanic connection between source and drain. FET devices for instance with a threshold voltage $V_{th}$>0 are normally-off devices. At zero gate voltage, so without gate control, no channel is present to conduct current. These transistors work in enhancement mode (E-mode).

To make a normally-off device, i.e. a device where no current can flow between source and drain when the gate is grounded or floating, typically a channel needs to be interrupted selectively under the gate contact (i.e. in the intrinsic part of the device, which is the part of the device where the current can be modulated) while at the same time preserving an as high as possible 2DEG density in the other regions (i.e. the extrinsic part of the device). FIG. 2 shows a cross section of a device with intrinsic and extrinsic parts. A gate bias above a certain positive threshold voltage will then induce a 2DEG under the gate contact allowing current to flow between source and drain.

Another issue with AlGaN/GaN HEMT's is the relative high contact resistance of the ohmic contacts, because of the high bandgap of the III-nitride material and the absence of impurity doping. One possible approach is the selective regrowth of n-type doped GaN, preferably with a low bandgap such as InGaN, in the regions under the ohmic contacts. In all known examples of this approach, the samples are taken out of the reactor and are patterned with SiOx for selective regrowth. This is very detrimental for the passivation of the surface of AlGaN/GaN HEMT.

Several methods have been reported to achieve such e-mode transistors:

Document U.S. 2010327293 (A1) recites an AlN buffer layer, an undoped GaN layer, an undoped AlGaN layer, a p-type GaN layer and a heavily doped p-type GaN layer that are formed in this order. A gate electrode forms an Ohmic contact with the heavily doped p-type GaN layer. A source electrode and a drain electrode are provided on the undoped AlGaN layer. A pn-junction is formed in a gate region by a two dimensional electron gas generated at an interface between the undoped AlGaN layer and the undoped GaN layer and the p-type GaN layer, so that the gate voltage swing can be increased.

This document does not provide a structure with good passivation

Further, growth of Junction Field Effect Transistors (JFET) where a p-type AlGaN layer on top of the AlGaN barrier causes depletion of the 2DEG, so it needs to be removed in the extrinsic device areas. The etching process to remove the p-GaN in the extrinsic device area is non-selective to the underlying layers and as such is very difficult to control.

In the above approach, p-type AlGaN is first grown everywhere on the wafer and then removed except in the gate area of the devices. As a consequence, etch depth is hard to control, plasma damage may result from it and the uncovered surface may be hard to passivate in further processing steps.

V. Kumar, et al. in "High transconductance enhancement-mode AlGaN/GaN HEMTs on SiC substrate" (see Kumar in EL39-24 2003) recite use of an inductively-coupled-plasma reactive ion etching (ICP-RIE), whereby recessed 1 µm gate-length enhancement-mode (E-mode) AlGaN/GaN high electron mobility transistors (HEMTs) were fabricated. These 1 µm gate-length devices exhibited maximum drain current density of 470 mA/mm, extrinsic transconductance of 248 mS/mm and threshold voltage of 75 mV. These characteristics are much higher than previously reported values for GaN-based E-mode HEMTs. However, for practical applications, the threshold voltage is too low. A unity gain cutoff frequency ($f_T$) of 8 GHz and a maximum frequency of oscillation ($f_{max}$) of 26 GHz were also measured on these devices.

These HEMTs are grown directly onto a substrate.

W. B. Lanford, et al. in "Recessed-gate enhancement-mode GaN HEMT with high threshold voltage" (see Lanford in EL41-7 2005) recite fabrication of enhancement-mode high electron mobility transistors (E-HEMTs) on GaN/AlGaN heterostructures grown on SiC substrates. Enhancement-mode operation was achieved with high threshold voltage ($V_T$) through the combination of low-damage and controllable dry gate-recessing and the annealing of the Ni/Au gates. As-recessed E-HEMTs with 1.0 mm gates exhibited a threshold voltage ($V_T$) of 0.35 V, maximum drain current ($I_{D,max}$) of 505 mA/mm, and maximum transconductance ($g_{m,max}$) of 345 mS=mm; the corresponding post-gate anneal characteristics were 0.47 V, 455 mA/mm and 310 mS/mm, respectively. The RF performance is unaffected by the post-gate anneal process with a unity current gain cutoff frequency ($f_T$) of 10 GHz. However, for practical applications, the threshold voltage is too low.

These HEMTs are grown directly onto a substrate.

Gate recess etching with and without post-etch RTA treatment. Due to the non-selective nature of the etch, the process is hard to control.

Yong Cai, et al. in "High-Performance Enhancement-Mode AlGaN/GaN HEMTs Using Fluoride-Based Plasma Treatment" (see Cai et al. In EDL26-7 2005) recite a novel approach in fabricating high-performance enhancement mode (E-mode) AlGaN/GaN HEMTs. The fabrication technique is based on fluoride-based plasma treatment of the gate region in AlGaN/GaN HEMTs and post-gate rapid thermal annealing with an annealing temperature lower than 500° C. Starting with a conventional depletion-mode HEMT sample, they found that fluoride-based plasma treatment can effectively shift the threshold voltage from −4V to 0.9 V. Most importantly, a zero transconductance ($g_m$) was obtained at $V_{gs}$=0V, demonstrating for the first time true E-mode operation in an AlGaN/GaN HEMT. At $V_{gs}$=0 V, the off-state drain leakage current is 28 μA/mm at a drain-source bias of 6 V. The fabricated E-mode AlGaN/GaN HEMTs with 1 μm-long gate exhibit a maximum drain current density of 310 mA/mm, a peak $g_m$ of 148 mS/mm, a current gain cutoff frequency $f_T$ of 10.1 GHz and a maximum oscillation frequency $f_{max}$ of 34.3 GHz.

Herein, $CF_4$ plasma treatment of the barrier layer is used. Fluorine plasma is known to have a detrimental effect on the dynamic behavior of the HEMT as it causes substantial increases in the dynamic on resistance. These HEMTs are directly grown on a substrate. F. Medjdoub, et al. in "Novel E-Mode GaN-on-Si MOSHEMT Using a Selective Thermal Oxidation" (and related patent application U.S. 61/080,983) recite a novel normally-off AlN/GaN metal-oxide semiconductor high electron mobility transistors (MOSHEMT) on 100-mm Si substrates for high-power applications that is demonstrated for the first time by means of a selective thermal oxidation of AlN. The formation of a high-quality insulating AlON layer resulting from the dry thermal oxidation of AlN at 900° C. in oxygen has been identified by transmission electron microscopy and X-ray photoelectron spectroscopy. The AlN thermal oxidation appears to be highly selective toward the SiN cap layer allowing the local depletion of the 2-D electron gas (self-aligned to the gate) and thus the achievement of normally-off operation. Threshold voltage ($V_T$) of +0.8 V and drain leakage current at $V_{GS}$=0 V well below 1 μA/mm are obtained reproducibly over the wafer. The comparison of the fabricated MOSHEMTs with the control sample (identical but non-oxidized) reveals a drastic shift of $V_T$ toward positive values and three to four orders of magnitude drain leakage current reduction.

The above HEMT's comprise a gate on an insulation layer, namely on AlON.

The above document recites growth of thin barriers capped with in-situ SiN with and without thermal oxidation of the barrier. Without the thermal oxidation, due to the Schottky nature of the gate, the performance of the first approach is limited by the gate over-drive ($V_g$<2V). In the case of the oxidation of the Al-rich barrier, issues remain with the leakage current, dielectric breakdown and reliability of the gate oxide. In both cases, the threshold voltage is too low for practical applications.

X. Hu, et al. in "Enhancement mode AlGaN/GaN HFET with selectively grown pn junction gate" recite the fabrication and characterization of an enhancement mode AlGaInGaN heterojunction field-effect transistor (HFET) with selectively grown pn junction gate. At zero gate bias the device channel is depleted due to the high built-in potential of the gate-channel junction. The selective area growth approach enables both depletion and enhancement mode HFETs to be fabricated on the same wafer thus opening up the possibility of designing high speed, low consumption GaN-based logical integrated circuits.

In the approach by Hu et al, first a HEMT is grown, after which the wafer is taken out of the reactor to be patterned with $SiO_x$ with openings in the gate area. Subsequently, p-type AlGaN is selectively grown in the openings. However, $SiO_x$ is not a suitable passivation layer for HEMT devices and may cause the oxidation of the AlGaN barrier top surface, which leads to an increased dynamic on-resistance. Furthermore, it can only be deposited ex-situ i.e. after the wafer has been removed from the epitaxial reactor and exposed to atmosphere. After re-growth of the p-type AlGaN, the $SiO_x$ needs to be removed and replaced by a suitable passivation layer. Even further, as the AlGaN barrier has been exposed to atmospheric conditions as well as a number of processing steps, the passivation process may be difficult to control.

WO 2000/19512 A is directed to a method for forming a narrow gate of a pseudomorphic high electron mobility transistor (PHEMT). The method includes providing a structure including a III-V substrate, a channel layer over the substrate, a doped barrier layer over the channel layer, a protective layer disposed on the donor layer, an etch stop layer disposed over the protective layer, source and drain contact layers disposed over the etch stop layer, and source and drain contacts. A mask (a layer of photoresist patterned by an electron beam) is provided over the surface of the structure and includes an aperture which exposes a surface portion of the contact layers. The method as described in connection with FIGS. 3a-3e allows the formation of a gate recess by selective wet etching, thereby avoiding damage to the structure from dry etching. Further, because of the wet etching selectivity, there is a need to measure the channel current between source and drain to determine the etching point. As a consequence, the method yields greater uniformity, better reproducibility, and is less labor intense. Still, above mentioned method does not seem to enable better regrowth.

SUMMARY OF THE INVENTION

The present invention therefore relates to an alternative method of growing III-V epitaxial layers on a substrate, to a semiconductor structure, to a device comprising the semiconductor structure, and to an electronic circuit comprising the device and/or the semiconductor structure. Embodiments of the present invention can have the advantage of overcoming one or more of the above disadvantages, without jeopardizing functionality and advantages thereof. An independent aspect of the present invention is a method to improve ohmic contacts to source and drain, by using a regrowth, selectively in the source and drain areas and making metallic ohmic contacts.

In one aspect, the present invention relates to a method of manufacturing a semiconductor III-V structure, such as a transistor, such as an E-mode transistor, etc. comprising
providing an active layer,
providing a protection layer stack for use as a mask for the active layer comprising a III-V evaporation layer, wherein the evaporation layer preferably has a thickness of 2-10 nm thick, such as 5 nm,
a III-V etch stop layer on top of the evaporation layer, and
a mask layer on top of the etch stop layer.

It also relates to a semiconductor III-V structure, and to a device comprising said structure. An active layer is a layer in which charge carriers flow from one electrode to another, whereby the flow can be controlled either inherently like a diode or explicitly, e.g. the source to the drain in a field effect transistor whereby the flow of charge is controlled by a gate. An active layer or layer stack comprises an electrically controllable material such as a semiconductor material configured to provide an electrical function such as a diode function or whose electrical conductivity can be modulated by a control electrode such as a gate.

In an example the protection layer stack is provided directly on the active layer. In another example further layers may be provided between the active layer and the protection layer stack.

In the present invention in an example a method for manufacturing a transistor, such as a JFET is provided, with selectively re-grown p-type AlGaN in a gate area, using a novel in-situ deposited protection layer stack as mask. A better interface is obtained to the regrown p-type AlGaN. The protection layer stack serves as an in-situ passivation layer for the device, allows precise control of its etching in the gate area and is an excellent mask for selective epitaxial re-growth. The transistor, such as the JFET, has superior performance compared to other types of e-mode HEMTs e.g. because of its excellent passivation, suitably high threshold voltage and large gate over-drive capability.

In an example the present invention describes an enhancement mode HEMT device by making an (In)AlGaN/GaN structure that is capped with a GaN/Al(Ga)N/SiN protective layer stack, which also serves as passivation layer for the active HEMT device. After a first epitaxial deposition of this structure, the top two (SiN and Al(Ga)N) layers of the protective layer stack are etched away in a gate area of the structure, leaving the GaN layer intact. This structure is then reintroduced into an MOCVD reactor, where the GaN is re-evaporated and p-type (Al)GaN is re-grown selectively in the gate area of the structure, yielding an enhancement mode structure, such as a transistor, such as a JFET or HEMT transistor.

The term "AlGaN" relates to a composition comprising Al, Ga and N in any stoichiometric ration ($Al_xGa_yN$), which composition may vary in layer, e.g. from having no Al at a bottom of the layer to having no Ga at a top of the layer. A composition such as (In)AlGaN may further comprise In an any suitable amount.

In an example an epitaxial structure on a substrate terminated by a functional layer comprising an Al-containing III-N alloy by capping it with a protective layer stack GaN/(Al(Ga)N)/SiN is provided, so that it subsequently may be subjected to various standard semiconductor process steps and yet can still be re-introduced in an MOCVD reactor such as for selective epitaxial re-growth onto the functional layer. A better interface of the Al(GaN)/SiN is obtained.

In an independent aspect of the present invention, a method to improve ohmic contacts to electrodes such as source and drain electrodes is provided, by using the same method to perform a regrowth but using different material, e.g. n-type InGaN, selectively in the electrode areas such as source and drain areas and making metallic ohmic contacts to that. For example, this solves the relative high contact resistance of the ohmic contacts with AlGaN/GaN HEMT's. In this use is made of the same protective stack for regrowth of n-type InGaN under the ohmic contacts. Hence in the method a source and a drain are provided through the protection layer stack on the active layer, wherein the source and drain comprise a III-V material, preferably a n-type III-V material, e.g. with a low bandgap energy, and wherein the source and drain are preferably selectively and epitaxially re-grown. A photo resist mask can be provided on top of the mask layer and source and drain regions are defined, preferably lithographically defined. Re-growth can be by MOCVD. The source and drain can comprise one or more of N, P, As, and one or more of B, Al, Ga, In and Tl, preferably n-type InGaN. The source and drain can be made of n-type III-V material.

As mentioned above the present method is in an example used in a CMOS process, as present process steps can be integrated therein without much (extra) effort.

A semiconductor structure according to embodiments of the present invention comprises in an example a substrate, such as a Si, SiC, Ge, Si-on-insulator, Ge-on-insulator, a free-standing GaN substrate, a free-standing AlN substrate and sapphire substrate, preferably a Si substrate, such as a <111> Si substrate, and combinations thereof, such as $Si_xGe_y$, and substrates comprising (initial) layers thereof, such as a stack of layers.

In an example, on the substrate an epitaxially grown buffer layer is provided. The buffer layer may be of a different nature than the substrate, in that for instance the band gap of the substrate and buffer layer are relatively far apart (such as 1.1 eV and 6.2 eV, respectively), at least a few eV apart, such as more than 2 eV, preferably more than 3 eV, more preferably more than 4 eV, in order to provide present characteristics, such as high break down voltage, e.g. larger than 250 V, preferably larger than 500 V, even more preferably larger than 1000 V, such as larger than 2000 V, or even much larger. The buffer layer is in an example a III-V buffer layer. Therein III refers to a Group III elements, now being Group 13 and Group 3 elements, such as B, Al, Ga, In, Tl, Sc, Y and Lanthanide and Actinide series. Therein V refers to a Group V elements, now being N Group elements, such as N, P, As, Sb, Bi. The buffer layer comprises a stack of layers, in an example typically the first one being a nucleation layer.

The structure can comprise a source and drain, which source and drain comprise a III-V material, preferably a n-type III-V material e.g. with a low bandgap, which III-V source and drain are preferably a selectively and epitaxial re-grown gate. Ohmic contacts are formed on the source and drain n-type III-V material.

In another example of the present invention, a HEMT device with low ohmic contact resistivity is provided by making an (In)AlGaN/GaN structure that is capped with a GaN/Al(Ga)N/SiN protective layer stack, which also serves as passivation layer for the active HEMT device. A better interface of the AlGaN/SiN is obtained. After a first epitaxial deposition of this structure, the top two (SiN and Al(Ga)N) layers of the protective layer stack are etched away in a source and drain area of the structure, leaving the GaN layer intact. This structure is then reintroduced into an MOCVD reactor, where the GaN is re-evaporated and n-type (In)(Al) GaN is re-grown selectively in the source and drain area of the structure, yielding an electronic structure, such as a transistor, such as a DHFET or HEMT transistor with low ohmic contact resistivity.

Thereby the present invention provides a solution to one or more of the above mentioned problems. Especially a leakage current is significantly reduced, dielectric breakdown is prevented, and/or reliability of the gate is improved, and/or a well controllable process is provided, and/or the 2DEG layer does not deplete in the extrinsic device area, and/or plasma damage is prevented, and/or oxidation of a barrier top surface is prevented, and/or dispersion is prevented and/or good dynamic performance of e.g. a transistor is maintained. Any, a combination of, or all of the above mentioned disadvantages are overcome hereby, or at least (effects thereof are) significantly reduced.

Advantages of the present description are detailed throughout the description.

DETAILED DESCRIPTION OF THE INVENTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter. Thus, the scope of the expression "a device comprising means A and B" should not be limited to devices consisting only of components A and B. It means that with respect to the present invention, the only relevant components of the device are A and B.

Similarly, it is to be noticed that the term "coupled" should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

The invention will be described by a detailed description of several embodiments of the invention. It is obvious that other embodiments of the invention can be configured by a person skilled in the art without departing form the true spirit or technical teaching of the invention, the invention therefore being limited only by the terms of the appended claims. It will be clear for a person skilled in the art that the present invention is also applicable to similar circuits that can be configured in any transistor technology, including for example, but not limited thereto, Bipolar, BICMOS . . . .

In a first aspect the present invention relates to a method of manufacturing a semiconductor III-V structure, such as a transistor, such as an E-mode transistor, etc. comprising
  providing an active layer,
  providing a protection layer stack for use as a mask for the active layer comprising a III-V evaporation layer, wherein the evaporation layer preferably has a thickness of 2-10 nm thick, such as 5 nm,
    a III-V etch stop layer on top of the evaporation layer, and
    a mask layer on top of the etch stop layer.

An active layer is a layer in which charge carriers flow from one electrode to another, whereby the flow can be controlled either inherently like a diode or explicitly, e.g. the source to the drain in a field effect transistor whereby the flow of charge is controlled by a gate. An active layer or layer stack comprises an electrically controllable material such as a semiconductor material configured to provide an electrical function such as a diode function or whose electrical conductivity can be modulated by a control electrode such as a gate.

The evaporation layer need not be very thick, as a too thick layer will e.g. consume extra chemicals and process time. The evaporation layer need not be very thin, as a too thin layer will not provide a pristine layer. Experimentally it has been found that the above thicknesses give at least satisfactory results.

In an example of the present method the III-V evaporation layer comprises one or more of N, P, As, and one or more of B, Al, Ga, In and Tl, preferably GaN. As such III-V layer compounds and combinations thereof may be selected. In an example good results were obtained with a GaN layer.

Also a layer may vary in composition, e.g. more of a first element at a bottom thereof, and more of a second element at a top thereof.

Also a layer may in fact be a stack of individual layers, or similar, a layer having a gradient in composition.

The III-V etch stop layer comprises one or more of N, P, As, and one or more of B, Al, Ga, In and Tl, preferably AlGaN. As such III-V layer compounds and combinations thereof may be selected. In an example good results were obtained with a AlN layer.

In an example the etch stop layer has a thickness of 0.3 nm-100 nm, preferably from 1-10 nm, such as 2-5 nm. The etch stop layer needs to have a minimal thickness in order to stop etching. Preferably the etch stop layer selectively stops etching. The etch stop layer need not be very thick. Typically 100 nm is sufficient. The thickness may vary e.g. depending on the etch chemistry used and time of etch processing. Etching may refer to dry etch, wet etch, and combinations thereof.

In an example the mask layer comprises one or more of Si, Al, O and N, such as SiN. In an example further some Al may be present, e.g. AlSiN.

In an example the mask layer has a thickness of 1-500 nm, preferably from 30-400 nm, more preferably from 50-300 nm, such as from 100-200 nm. The mask layer should be thick enough to provide is mask function, i.e. thicker than 1 nm. Good results were obtained with mask layer of 20-150 nm. Even further the mask layer may be thickened with SiN and/or SiO.

It is observed that to some extent the above dimensions depend on a technology used, i.e. a more advanced technology using relatively smaller features will function better when using relatively smaller isolations and spaces.

In an example of the present method the buffer layer is capped with one or more protective layers before forming e.g. a gate, such as a III-V layer, such as GaN, AlN, and AlGaN, a SiN layer, and combinations thereof.

Typical examples and dimensions are given in the description of the drawings below.

In an example of the present method the one or more protective layers are a stack of GaN, applied on the active layer, an AlN layer applied on the GaN layer, and a SiN layer applied on the AlN layer.

The one or more protective layers protect the underlying active layer during subsequent processing. As a consequence the present semiconductor structure is fully compatible with other processes, in particular CMOS processes. Even further, as the active layer is protected it remains in excellent shape and can be processed further without extra precautions. Even further, by the nature of the present process, wherein the one or more protective layers are removed, such as by wet and/or dry etching, the surface of an active layer obtained thereby is in excellent condition to be further processed, such as for re-growth. The above makes clever use of advantages obtained by the present process.

In a preferred example, the mask layer is SiN with high density, deposited in-situ in the MOCVD reactor. This SiN may be stoichiometric or non-stoichiometric. In another example, the SiN may contain some Al(AlSiN). In an example it is typically 10 nm-500 nm, such as 200 nm thick.

In an example of the present method the one or more protective layers are locally removed, preferably selectively removed, prior to re-growth.

In order to obtain a high quality surface of the buffer layer the one or more protective are removed, such as by selectively dry and/or wet etching thereof. These processes are well known by the person skilled in the art.

In an example of the present method a gate is provided through the protection layer stack on the active layer, wherein the gate comprises a III-V material, preferably a p-type III-V material, and wherein the gate is preferably selectively and epitaxially re-grown, where the Mg-doping is activated by annealing in nitrogen ambient and on top of which an ohmic contact is formed.

The gate forms part of a semiconductor device to be formed, such as a transistor. As mentioned above in principle any III-V material being suitable for the envisaged purpose may be applied. In view of an E-mode device a p-type material is preferred.

In an example of the present method, source and drain contacts are provided through the protection layer stack on the active layer, wherein the source and drain comprise a III-V material, preferably a n-type III-V material e.g. with a low bandgap energy, and wherein the source and drain is preferably selectively and epitaxially re-grown.

The source and drain form part of a semiconductor device to be formed, such as a transistor. As mentioned above in principle any III-V material being suitable for the envisaged purpose may be applied. In view of a low ohmic contact resistance device an n-type material with low bandgap is preferred.

In an example of the present method re-growth is performed selectively, preferably by patterning the mask layer with patterns, wherein preferably re-growth of a III-V layer is performed, such as a III-N layer.

In an example of epitaxial re-growth, the surface of the starting material needs to be in a pristine condition ("epi-ready") because nucleation of re-grown epitaxial layers is amongst others determined by atomic configuration of this surface. Such a selectively re-grown epitaxial layer provides the best characteristics in view of the above and below mentioned advantages obtained by the present invention. Because alloys containing e.g. Al in general and (In)Al(Ga)N alloys specifically are very prone to oxidation and other types of contamination (scratches, changes in surface stoichiometry, etc.), any (in between) process step may deteriorate the surface condition of these layer stacks and make it impossible to do a high quality epitaxial growth on top of it.

By tuning growth conditions, epitaxial re-growth of e.g. GaN occurs on a substrate or on a first epitaxial structure but not on dielectric (SiOx or SiN) patterns. This refers to the term "selective" growth, and is due to the fact that e.g. GaN does not nucleate on $SiO_x$ or SiN. It is known that adding Al to the GaN materials reduces this selectivity. More specifically, epitaxial growth of AlN is not selective because of the low mobility of Al-atoms on the growth surface. As such, the deposition of Al-rich AlGaN needs to occur before any patterning is done. However, exposure of Al-rich alloys to atmosphere or process conditions leads to the contamination of the top surface as described above.

In an example of the present method a photo resist mask is provided on top of the mask layer and a gate region is defined, preferably lithographically defined. Such may be by any form of radiation, such as light, such as, depending on dimensions to be obtained, IR, UV, deep UV, e-UV etc, and e-beam. In CMOS processes an optical lithographic process is preferred, e.g. in view of compatibility. The person skilled in the art will be able to provide a suitable photo resist mask for a given process.

In an example of the present method the gate comprises one or more of N, P, As, and one or more of B, Al, Ga, In and Tl and one or more of Mg, C, Zn, Hg, Be, Li and Cd, preferably Mg-doped p-type AlGaN, with a metallic ohmic contact on top of the p-AlGaN. p-type AlGaN provides particularly good characteristics.

In an example of the present method the source and drain comprise one or more of N, P, As, and one or more of B, Al, Ga, In and Tl and one or more of Si and Ge, preferably Si-doped n-type InGaN, with a metallic ohmic contact on top of the n-InGaN. n-type InGaN provides particularly good characteristics.

In an example of the present method further comprises
   providing a substrate, such as a Si, SiC, Ge, Si-on-insulator, Ge-on-insulator, sapphire substrate, a free-standing GaN substrate, a free-standing AlN substrate and combinations thereof, preferably a Si substrate, such as a <111> Si substrate, and
   providing an epitaxial III-V semiconducting layer stack on top of the substrate, comprising:
   a first active III-V layer, preferably a III-N layer, and
   a second active III-V layer, preferably a III-N layer.

A 2DEG (two dimensional Electron Gas) is formed between the two active layers. In an example the first active III-V layer has a thickness of 20-500 nm, preferably from 30-300 nm, more preferably from 50-250 nm, such as from 100-150 nm, and/or the second active III-V layer has a thickness of 10-100 nm, preferably from 20-50 nm. Such a combination of thicknesses provides good characteristics for the active layer, e.g. in terms of the 2DEG obtained.

In an example the first active III-V layer comprises one or more of N, P, As, and one or more of B, Al, Ga, In and Tl, preferably GaN, and/or
   the second active III-V layer comprises one or more of N, P, As, and one or more of B, Al, Ga, In and Tl, preferably AlGaN. As mentioned above compositions of III-V layers may be chosen in view of characteristics to be obtained, and compositions may vary accordingly. In an example good results were obtained with a first GaN layer of about 150 nm thickness, and a second AlGaN layer of about 20 nm thickness.

In a second aspect the present invention relates to a semiconductor III-V structure, such as a transistor, such as an E-mode transistor, comprising
   an active layer,
   a protection layer stack for the active layer for use as a mask comprising
   a III-V evaporation layer, wherein the evaporation layer preferably has a thickness of 2-10 nm thick, such as 5 nm,
   a III-V etch stop layer on top of the evaporation layer, and
   a mask layer on top of the etch stop layer.
      The present semiconductor structure provides any, a combination of, or all of the following advantages: a leakage current that is significantly reduced, a gate dielectric breakdown that is postponed, a reliability of the gate that is improved, a suitably positive threshold voltage, a 2DEG layer that does not deplete in the extrinsic device area, no oxidation of a barrier top surface, no dispersion resulting in good dynamic performance of e.g. a transistor is maintained, etc.
      In an example of the present semiconductor structure comprises a gate, which gate comprises a III-V material, preferably a p-type III-V material, which III-V gate is preferably a selectively and epitaxial re-grown gate.
      In an example of the present semiconductor structure comprises a source and a drain, which source and drain comprise a III-V material, preferably a n-type III-V material, which III-V source and drain are preferably a selectively and epitaxial re-grown source and drain.

Advantages of the present structure are described above and below.

In a third aspect the present invention relates to a to a device comprising the semiconductor structure, such as a transistor, such as an E-mode transistor, such as a JFET, transistor, a FET, a HEMT, such as an enhancement mode HEMT, a DHFET, a LED, a diode, and a power device. Types of FETs and applications thereof considered are for example: a DGMOSFET being a MOSFET with dual gates; a DNAFET being a specialized FET that acts as a biosensor, by using a gate made of single-strand DNA molecules to detect matching DNA strands; a HEMT (High Electron Mobility Transistor), also called an HFET (heterostructure FET), which can be e.g. made using band gap engineering in a ternary semiconductor such as AlGaN; a DHFET (double heterostructure field effect transistor), a fully depleted wide-band-gap material forms an isolation between gate and body; power MOSFETs are still a device of choice for drain-to-source voltages of 1 to 200 V; an ISFET being an Ion-Sensitive Field Effect Transistor used to measure ion concentrations in a solution; when the ion concentration (such as H+, see pH electrode) changes, a current through the transistor will change accordingly; a JFET (Junction Field-Effect Transistor) that uses a reverse biased p-n junction to separate a gate from the body; a MESFET (Metal-Semiconductor Field-Effect Transistor) that substitutes a p-n junction of the JFET with a Schottky barrier; used in GaAs and other III-V semiconductor materials; a MODFET (Modulation-Doped Field Effect Transistor) that uses a quantum well structure formed by graded doping of an active region; a MOSFET (Metal-Oxide-Semiconductor Field-Effect Transistor) that utilizes an insulator (typically SiO2) between a gate and a body; and IGBTs that see application in switching internal combustion engine ignition coils, where fast switching and voltage blocking capabilities are important.

In FETs electrons can flow in either direction through the channel when operated in the linear mode, and the naming convention of drain terminal and source terminal is somewhat arbitrary, as the devices are typically (but not always) built symmetrically from source to drain. This makes FETs suitable for switching analog signals (multiplexing) or electrical power between paths (bidirectional power switching). With this concept, one can construct a solid-state mixing board or a power matrix converter, for example.

For some applications, e.g. high voltage FETs, the device is typically built asymmetrically, with the drain terminal being separated from the source and gate terminal by a larger spacing to withstand high voltage between the drain terminal and other terminals In a fourth aspect the present invention relates to a to an electronic circuit comprising the device and/or the semiconductor structure, such as an electronic circuit, a switch, high power RF amplifier, high power application, high voltage application, image sensor, biosensor, and ion sensor.

The electronic circuit finds application in e.g. digital circuits and power applications as well, including modern clocked analog circuits, voltage regulators, amplifiers, power transmitters, power convertors such as AC-DC converters, DC-DC converters (such as e.g. half-bridge, full-bridge or push-pull circuits), and DC-AC converters, motor drivers, etc.

The present electronic circuit is e.g. applied in the mentioned digital circuit, or in circuits for power conversion and power switching applications.

The present electronic circuit is applied in e.g. a biosensor being an analytical device for the detection of an analyte that combines a biological component with a physicochemical detector component. In an example it consists of 3 parts:

a sensitive biological element, a biologically derived material or biomimic;

a transducer or a detector element that transforms the signal resulting from the interaction of the analyte with the biological element into another signal; and associated electronics or signal processors.

The present electronic circuit is applied in e.g. a gas sensor or ion sensor.

The invention is further detailed by the accompanying figures, which are exemplary and explanatory of nature and are not limiting the scope of the invention. To the person skilled in the art it may be clear that many variants, being obvious or not, may be conceivable falling within the scope of protection, defined by the present claims.

BRIEF DESCRIPTION OF THE DRAWINGS

FIG. 1 shows a cross section of a epitaxial layer stack.

FIG. 2 shows a cross section of a semiconductor device with intrinsic and extrinsic parts.

FIG. 3a-h show cross sections of methods step of manufacturing a semiconductor device according to the invention.

DETAILED DESCRIPTION OF THE DRAWINGS

In this invention an enhancement mode transistor, such as a HEMT and JFET, are provided, comprising a first active (InAl)GaN layer (channel, layer 1 in FIG. 1), a second active InAlGaN layer (barrier, layer 2) and a protective layer stack comprising GaN evaporation layer (layer 3), an Al(Ga)N etch stop layer (layer 4) and SiN masking layer (layer 5), where this AlGaN etch stop layer (FIG. 3*c*) and SiN masking layer (FIG. 3*b*) are removed in the gate region of the device. P-type (Al)GaN is then re-grown selectively in this area (FIG. 3*f*) after evaporation of the GaN evaporation layer (FIG. 3*e*). On places where the protective layer stack has not been removed, the top SiN masking layer acts as a mask for the selective re-growth process so that no growth takes place there. The protective layer stack also acts as a passivation layer for the device.

The top SiN masking layer (layer 5) will protect the underlying III-nitride layers during any process steps necessary, e.g. lithography (FIG. 3*a*) before local removal of the AlGaN etch stop layer and SiN masking layer in the gate area, e.g. because of its high temperature stability and chemical properties. Moreover, it protects the active device layers during epitaxial re-growth of the p-AlGaN in the gate area. SiN and SiOx are the two most commonly used dielectrics in Si CMOS technology, in particular as a (sacrificial) capping material to protect sensitive wafer areas during additional processing. In a preferred embodiment, this layer is stoichiometric SiN with high density, deposited in-situ in the MOCVD reactor. It has been shown experimentally by inventors that e.g. a HEMT structure that is capped with in-situ SiN is not affected by processing steps that have a high temperature budget, whereas structures capped with GaN caps or uncapped structures show a significant reduction of channel density and electron mobility.

In another example, SiN contains some Al(AlSiN). It is typically 200 nm thick (1 nm-500 nm). The in-situ SiN may be thickened externally by PECVD or LPCVD SiN or SiOx (for thicknesses beyond 500 nm) before any other processing takes place.

An exact profile of a recess formed may be controlled by changing parameters of an ICP or RIE etching system; this is important because a sloped recess will determine the shape of the electrical field peak when a device is in pinch-off status and may allow to locally reduce maximum field strength, which is important for reliability of a device.

The protective layer stack comprises an Al(Ga)N etch stop layer (layer 4) below the SiN. Both dry and wet etches of SiN in a fluorine chemistry will stop on the Al(Ga)N etch stop layer with very high selectivity (see FIG. 3b), so it allows for thorough removal of the remaining SiN without removing the Al(Ga)N etch stop layer or any of the layers below. In a preferred embodiment, this layer is pure AlN or Al-rich AlGaN and the AlN or Al-rich AlGaN is then removed in a wet etch, e.g. in an alkaline solution or in resist developer, exposing the underlying GaN evaporation layer (see FIG. 3c). Because such etch process does not etch the GaN evaporation layer (i.e. the etch is very selective), its thickness can be kept very thin. This is important because it has been found that presence and properties of this layer affect a polarization charge profile and band alignment of the entire heterostructure and as a result properties of a 2DEG (e.g. electron density). By keeping the GaN layer thin, this impact is reduced.

In another example, the Al(Ga)N etch stop layer also contains some Ga, and removal is done in a controlled dry etch process (which is less selective or non-selective towards GaN).

A wafer is then loaded back into an MOCVD reactor for re-growth of p-type (Al)GaN (structure as depicted in FIG. 3d). p-Type III-nitrides are typically grown by doping a material with a suitable material, such as Mg, Be, C or Zn, e.g. by flowing $Cp_2Mg$ in the reactor. Prior to re-growth, the layer stack is heated up to high temperature under ammonia overflow. Under selected conditions, the GaN evaporation layer evaporates in the gate areas where it has been uncovered by local removal of the SiN masking layer and Al(Ga)N etch stop layer, exposing a second active layer (see FIG. 3e). As this layer has to this point always been capped and never been exposed to any possible source of contamination, its surface is in the right pristine condition to allow for epitaxial re-growth. The growth will only occur in on the surface where the SiN masking layer and Al(Ga)N etch stop layer have been removed (FIG. 3f). Typically, the re-grown layer is from 50-400 nm thick, such as form 100-250 nm, e.g. 150 nm thick and has a p-type doping level of $5 \cdot 10^{16}$-$1 \cdot 10^{20}/cm^3$, such as $1 \cdot 10^{17}$-$1 \cdot 10^{19}/cm^3$, such as about $1 \cdot 10^{18}/cm^3$.

The source and drain contacts are ohmic contacts to the 2DEG and can be made by depositing metal stacks (such Ti Al Ni Au, Ti Al Mo Au, Ti Al Ti Au, Ti Al TiW, Ti Al W, Ti Al WCr, . . . ) in contact with any layer of the protective layer stack or in contact with the second active layer (FIG. 3g). The second active layer may be recessed prior to metal deposition. This may require local selective removal, in a source and drain area, of some of the layers of the protective layer stack by etching. In an example this removal is done in a dry etching system based on fluorine chemistry, e.g. in an inductively coupled plasma system using $SF_6$ or $CF_4$ as etching gas and RF (or "platen") and ICP (or "coil") etching powers of 10 W and 150 W respectively.

In an example, n-type (In)GaN is regrown selectively in the source area (9a in FIG. 3h) and drain area (9b in FIG. 3h) prior to depositing metal stacks (source contact 9c and drain contact 9d in FIG. 3h), after having removed the SiN masking layer and AlN etch stop layers as described above.

The contact properties may be further improved by thermal annealing, typically at a temperature between 800° C. and 900° C., such as at 850° C., in a nitrogen atmosphere or a forming gas atmosphere. When the contacts have been deposited on regrown n-type InGaN, the annealing temperature can be much reduced, e.g. below 600° C. This lowered thermal budget can enable new processing options, e.g. a gate first approach where the gate is defined before the ohmic contacts.

In an example, the processing continues by defining the isolation patterns. This is done by performing photoresist deposition and a photolithography step. In an example the photoresist patterns thus formed act as a mask for the etching of a mesa, e.g. in a dry etching system based on chlorine chemistry, e.g. in an inductively coupled plasma system using $Cl_2$ or $BCl_3$ as etching gas and RF (or "platen") and ICP (or "coil") etching powers of 50 W and 150 W respectively. In another example, patterns thus formed act as a mask for impurity implantation, e.g. by implanting nitrogen, helium, hydrogen, boron, iron, or magnesium. In an example, the impurity implantation uses triple implantation steps, e.g. one step at an acceleration voltage of 30 keV, implanting a dose of 6 times $10^{12}/cm2$ of $N^{14}$, a second step at an acceleration voltage of 160 keV, implanting a dose of 1.8 times $10^{13}/cm2$ of $N^{14}$ and a third step at an acceleration voltage of 400 keV, implanting a dose of 2.5 times $10^{13}/cm2$ of $N^{14}$.

The gate contact is formed by making an ohmic contact to the re-grown p-type (Al)GaN in the gate area (FIG. 3g). First, the p-type AlGaN needs to be activated (i.e. breaking the bonds between hydrogen and magnesium that renders the Mg electrically inactive), for instance by annealing in nitrogen atmosphere at a temperature at 700° C. During this activation step, the surface of the p-type AlGaN may be protected by a sacrificial layer (e.g SiOx). The activation of the p-type AlGaN can be done before the implant isolation step because the high temperature may degrade the isolation performance of the implantation. The ohmic contact metallisation typically comprises Ni/Pt/Au that is alloyed in an oxygen-containing atmosphere at temperatures around 700° C.

In an example, additional passivation layers are added. In an example, the passivation layer comprises SiN or Si-oxide, e.g. deposited by LPCVD, or PE-CVD or ICP-CVD. In an example, openings are made in the passivation layer to uncover the device terminals, by performing a photolithography step and etching the passivation layer, e.g. by wet etching in HF or buffered HF or by dry etching in an RIE or ICP plasma tool in a fluorine chemistry.

In an example, additional metal interconnect layers are defined using methods known to a person skilled in the art, to allow low resistivity current pathways for the gate, source and drain currents.

In an example, additional dielectric layers are added to prevent surface flash-over or breakdown in air. In a preferred example, the active device is a transistor. The transistor is in an example defined as a HEMT device, or as a JFET transistor. Various types of HEMT devices are know from literature, e.g. PHEMT, E-HEMT, D-HEMT or DHFET. In another example, the active device is a diode. In another example, the active device is a light-emitting diode.

Two or more of the above method steps, examples, dimensions, etc. may be combined in the present invention, depending on for instance requirements of a final device, transistor, etc.

The invention claimed is:

1. A method of manufacturing a semiconductor III-V structure, comprising:
    providing a substrate;
    providing an active layer, by epitaxially growing a III-V semiconducting layer stack on top of the substrate, wherein epitaxially growing the III-V semiconducting layer stack comprises (i) growing a first active III-V layer and (ii) growing a second III-V active layer, thereby forming a two-dimensional electron gas between the first III-V active layer and the second III-V active layer;
    providing a protection layer stack for use as a mask for the first III-V active layer and the second III-V active layer, wherein the protection layer stack comprises (i) a III-V evaporation layer, (ii) a III-V etch stop layer on top of the evaporation layer, and (iii) a dielectric mask layer on top of the etch stop layer;
    locally etching the dielectric mask layer and the III-V etch stop layer in a gate region; and
    evaporating the III-V evaporation layer in the gate region to expose the second III-V active layer, wherein the dielectric mask layer remains in a region outside the gate region after evaporating the III-V evaporation layer in the gate region.

2. The method of claim 1, wherein the III-V evaporation layer comprises one or more of N, P, or As, and one or more of B, Al, Ga, In, or Tl, and wherein the evaporation layer has a thickness of 2 nm-10 nm.

3. The method of claim 1, wherein the III-V etch stop layer comprises one or more of N, P, or As, and one or more of B, Al, Ga, In, or Tl.

4. The method of claim 1, wherein the etch stop layer has a thickness of 0.3 nm-100 nm.

5. The method of claim 1, wherein the dielectric mask layer comprises one or more of Si, Al, O, or N.

6. The method of claim 1, wherein the dielectric mask layer has a thickness of 1 nm-500 nm.

7. The method of claim 1, further comprising providing a gate through the protection layer stack, wherein (i) the gate comprises a p-type III-V material, and (ii) the gate is selectively and epitaxially re-grown in the gate region.

8. The method of claim 7, further comprising forming an ohmic contact on the gate.

9. The method of claim 7, wherein the gate being re-grown comprises the gate being re-grown by metal organic vapor phase epitaxy.

10. The method of 7, wherein the gate comprises one or more of N, P, or As, and one or more of B, Al, Ga, In, or Tl.

11. The method of claim 7, further comprising:
    providing a photoresist mask on top of the dielectric mask layer.

12. The method of claim 7, further comprising providing a source and a drain through the protection layer stack, (i) the source and drain comprise an n-type III-V material, and (ii) the source and drain are selectively and epitaxially re-grown.

13. The method of claim 12, wherein an ohmic contact is formed on the source and drain.

14. The method of claim 12, wherein the source and drain being re-grown comprises the source and drain being re-grown by metal organic vapor phase epitaxy.

15. The method of claim 12, wherein the source and drain comprises one or more of N, P, or As, and one or more of B, Al, Ga, In, or Tl.

16. The method of claim 1, wherein:
    the substrate comprises a <111> silicon substrate;
    the first active III-V layer is a III-N layer; and
    the second active III-V layer is a III-N layer.

17. The method of claim 1, wherein the first active III-V layer has a thickness of 20 nm-500 nm.

18. The method of claim 1, wherein the second active III-V layer has a thickness of 10 nm-100 nm.

19. The method of claim 1, wherein the first active III-V layer comprises one or more of N, P, or As, and one or more of B, Al, Ga, In, or Tl.

20. The method of claim 1, wherein the second active III-V layer comprises one or more of N, P, or As, and one or more of B, Al, Ga, In, or Tl.

21. A semiconductor structure comprising:
    an active layer comprising (i) a first active III-V layer and (ii) a second active III-V layer, wherein a two-dimensional electron gas is formed between the first active III-V layer and the second active III-V layer;
    a protection layer stack configured for use as a mask, wherein the protection layer stack comprises (i) a III-V evaporation layer, wherein the evaporation layer has a thickness of 2 nm-10 nm, (ii) a III-V etch stop layer on top of the evaporation layer, and (iii) a dielectric mask layer on top of the etch stop layer; and
    a gate, wherein (i) the gate comprises a p-type III-V material, and (ii) the gate is selectively and epitaxially re-grown in contact with the second active III-V layer.

22. The semiconductor structure of claim 21, further comprising an ohmic contact formed on the gate.

23. The semiconductor structure of claim 21, further comprising a source and a drain, wherein (i) the source and the drain comprise an n-type III-V material, and (ii) the source and the drain are selectively and epitaxially re-grown.

24. The semiconductor structure of claim 23, further comprising an ohmic contact formed on the source and the drain.

25. The semiconductor structure of claim 21, wherein the semiconductor structure is included within a transistor device.

26. The semiconductor structure of claim 21, wherein the semiconductor device is included in an electronic circuit selected from the group consisting of a switch, a high-power application circuit, a high-voltage application circuit, an image sensor, a biosensor, an integrated logic circuit, and an ion sensor.

* * * * *